(12) United States Patent
Whitehurst et al.

(10) Patent No.: US 6,468,439 B1
(45) Date of Patent: Oct. 22, 2002

(54) ETCHING OF METALLIC COMPOSITE ARTICLES

(75) Inventors: Donald A. Whitehurst, Minneapolis; Paul D. Wyatt, St. Paul; Charles Ring, Eagle Bend; Michael J. Dufresne, Shoreview; Jose F. Brenes; Bruce A. Finger, both of St. Paul; Dave R. Zeipelt, Forest Lake, all of MN (US)

(73) Assignee: BMC Industries, Inc., Minneapolis, MN (US)

( * ) Notice: Subject to any disclaimer, the term of this patent is extended or adjusted under 35 U.S.C. 154(b) by 0 days.

(21) Appl. No.: 09/431,649

(22) Filed: Nov. 1, 1999

(51) Int. Cl.$^7$ .............................. C23F 1/00; B44C 1/22
(52) U.S. Cl. ............................ 216/95; 216/13; 216/20; 216/100; 216/102; 216/105; 438/754
(58) Field of Search .............................. 216/13, 20, 33, 216/41, 95, 100, 102, 105; 438/737, 738, 745, 754

(56) References Cited

U.S. PATENT DOCUMENTS 3,495,324 A * 2/1970 Guthrie et al. .......... 438/754 X
3,801,388 A    4/1974 Akiyama et al. ............... 156/3

(List continued on next page.)

FOREIGN PATENT DOCUMENTS

| EP | 0930645 | 7/1999 | ........... H01L/21/60 |
| EP | 0753598 | 11/1999 | ............. C22F/3/00 |
| EP | 0696882 | 12/1999 | ............ H05K/7/20 |
| WO | 97/43081 | 11/1997 | ............ B23K/35/26 |
| WO | 97/45242 | 12/1997 | ........... B29C/45/14 |
| WO | 98/14765 | 4/1998 | ............ G01M/7/02 |

OTHER PUBLICATIONS

Chow, T.P., et al., "Plasma Etching of Refractory Gates of Metals, Silicides and Nitrides", *In: Dry Etching for Microelectronics*, R.A. Powell, ed., Elsevier Science Publishers, New York, 39–77, (1984).

Kern, W., et al., "Improved Reliability of Electron Devices Through Optimized Coverage of Surface Topography", *11th Annual Proceedings Reliability Physics*, Las Vegas, Nevada, 214–223, (Apr. 3–5, 1973).

Wernick, S., et al., "Chemical Cleaning and Etching", *In: The Surface Treatment and Finishing of Aluminum and its Alloys*, Finishing Publications, England, 190–203, (1990).

*Primary Examiner*—William A. Powell
(74) *Attorney, Agent, or Firm*—Mark A. Littman & Assoc. P.A.

(57) ABSTRACT

A process for the etching of multiple layers of at least two different metals comprises:

forming a resist pattern over a first layer of metal, said resist pattern having a pattern of openings therein, applying a first etch solution onto said resist pattern so that at least some etch solution contacts exposed areas of the first layer of metal, etching away the majority of the depth of the first metal in exposed areas of metal in the first layer of metal, applying a second etch solution onto the resist pattern the second etch solution having a rate of etch towards the first metal as compared to the first etch solution that is at least 20% less than the millimeter/minute rate of etch of the first etch solution at the same etch solution temperature, removing the second etch solution from said resist pattern after at least the first metal layer has been etched sufficiently to expose areas of a second metal layer underlying the first metal layer by forming an etched first metal layer, and applying a third etch solution to said etched first metal layer, the third etch solution having a faster rate of etch towards the second metal than towards the first metal to etch into said second metal layer without destroying the etched first metal layer.

20 Claims, 4 Drawing Sheets

U.S. PATENT DOCUMENTS

| | | | |
|---|---|---|---|
| 3,994,758 A | 11/1976 | Ogawa et al. | 156/3 |
| 4,404,059 A | 9/1983 | Livshits et al. | 156/629 |
| 4,650,543 A | 3/1987 | Kishita et al. | 156/643 |
| 4,824,803 A | 4/1989 | Us et al. | 437/192 |
| 5,153,754 A | 10/1992 | Whetten | 359/59 |
| 5,221,428 A * | 6/1993 | Ohsawa et al. | 216/20 X |
| 5,428,250 A | 6/1995 | Ikeda et al. | 257/761 |
| 5,464,500 A | 11/1995 | Tsujimura et al. | 216/34 |
| 5,912,506 A | 6/1999 | Colgan et al. | 257/750 |
| 5,976,391 A | 11/1999 | Belke et al. | 216/13 |
| 5,985,746 A | 11/1999 | Kapoor | 438/622 |
| 6,019,910 A | 2/2000 | Achari et al. | 252/9.5 |
| 6,168,725 B1 * | 1/2001 | Achari et al. | 216/105 X |
| 6,197,435 B1 * | 3/2001 | Tsujimura et al. | 216/100 X |
| 6,222,136 B1 | 4/2001 | Appelt et al. | 174/254 |

\* cited by examiner

ETCHING OF METALLIC COMPOSITE ARTICLES

BACKGROUND OF THE INVENTION

1. Field of the Invention

The invention relates to the etching of metal layers in combination or electrical contact with other metal layers. The invention also relates to particular etchant solutions used to etch metal layers, and particularly to etch aluminum layers in Galvanic contact with other metal layers. Articles formed from etched multiple metal layers may be used in electronic devices, and more particularly in circuitry or circuit boards. The invention is especially advantageous when applied to manufacturing processes for thin circuit boards, particularly circuit boards with multiple layers of individually prepared circuits. These circuit boards provide physically durable structures, even when including fragile microstructure such as air bridges.

2. Background of the Art

Metals have been conveniently etched to form complex designs, including circuitry, for many years. A mask or resist layer in the shape of a pattern to be removed from a metal layer is placed over a surface of the metal layer, a solution that dissolves or removes the metal is conracted with the mask on the surface of the metal layer, and because the soltuion can contact only the exposed metal through the mask directly, a pattern of metal is removed from the metal layer that corresponds to the pattern in the mask. Although the underlying technology for this process appears fairly simple and direct, there are many complications in the actual performance of the process. For example, the resist must provide good resolution for the image, the etchant solution must have properties so that it etches the metal along vertical lines rapidly, yet doesn't undercut (etch along the side walls produced by the etching process), and with metal layers composites (elements having more than one metal layer, and layers of different metals) shoul be able to be etched one adjacent layer at-a-time, so that the solution does not etch completely through all of the layers. These are high performance standards that are not readily achieved, A technique for forming a tri-layer metal structure is described in U.S. Pat. No. 5,428,250 to Ikeda et al. The tri-layer metal structure is formed on a glass substrate. The first layer is a Ta—M—N film, the second layer is a Ta film and the third (top) layer is a Ta—M—N film, where M is at least one atom selected from the group consisting of Molybdenum, Niobium, and Tungsten.

U.S. Pat. No. 5,153,754 to Whetten described a tri-layer metal structure formed on an LCD substrate where the first layer is a titanium (Ti) film, the second layer is a molybdenum (Mo) or aluminum (Al) film, and the third (top) layer is a titanium (Ti) film. In addition, colum 6, lines 56–70 describe a process to taper etch the tri-layer metal structure. When the second layer is a molybdenum film, the tri-layer structure is formed by wet etching the titanium first layer with fluoroboric acid ($HBF_4$), wet etching the molybdenum second layer with PAWN (phosphoric acid, acetic acid, water and nitric acid), and dry etching the titanium third layer in a plasma barrel etcher with an atmosphere of $CF_4$ and $O_2$ (or $SF_6$ and $O_2$). When the second layer is an aluminum film, the tri-layer structure is formed in a single etch step by an RIE (reactive ion etching) etch of $BCl_3$, $CCl_4$ and $O_2$.

U.S. Pat. No. 5,464,500 to Tsujimura et al. describes a tri-layer metal structure formed on a glass substrate. A silicon oxide layer is formed on the glass substrate. The first metal layer of Aluminum (Al) is formed on the silicon oxide layer. The second metal layer of aluminum oxide is formed on the first metal layer. The third metal layer of molybdenum is formed in the aluminum oxide layer. Beginning at column 3, line 60, a process for taper etching the tri-metal layer is described. As a result, the cross section of the first metal layer of aluminum is formed with a taper angle.

U.S. Pat. No. 4,824,803 to Us et al. describes a tri-layer metal structure formed on a glass layer wherein the first metal layer is a titanium (Ti) film, the second metal layer is an Aluminum (Al) film, and the third metal layer is a titanium film. As described beginning at column 2, line 45, the tri-metal structure is formed in a single RIE etch step of a chlorine based chemistry. As shown in FIGS. 1a and 1b, the RIE etch step results in a non-tapered structure with vertical sidewalls.

U.S. Pat. No. 4,650,543 teaches a GaAs FET electrode wiring layer or bonding pad having a three-layered structure of Au/Pt/Ti or a two-layered structure of Al/Ti. The electrode wiring layer or the bonding pad is sometimes formed by a wet etching method but mainly by a lift-off method. A method of forming a bonding pad by wet etching is described. In this case, an insulating film is formed on a GaAs semiconductor substrate by CVD, and thereafter a contact hole is selectively formed in the insulating film. A metal film for forming a bonding pad is deposited on the overall surface of the substrate, and a resist pattern is formed thereon. Finally, the metal film is etched by wet etching using the resist pattern as a mask so as to form a bonding pad of the metal film on the hole of the insulating film. In this method, since the GaAs semiconductor layer is highly sensitive to chemical treatment, when the wet etching method is used, side etching occurs. For this reason, this method is inappropriate for forming a micropattern such as a gate electrode. Note that in a GaAs FET, a submicron micropattern must be formed. Therefore, a lift-off method was developed for micropatterning. This method is described in U.S. Pat. No. No. 3,994,758. However, the metal film formed by this method was formed by CVD (Chemical Vapor Deposition) at a low temperature because of a resist film. For this reason, bonding between a metal multilayer and a semiconductor substrate constituting an electrode pattern was inadequate. Therefore, the electrode pattern was easily removed during lifting off or wire bonding, thus degrading the yield in manufacturing of the GaAs FET. This Patent asserted an advance in the technology by the electrode pattern having a multilayer structure selected from the group consisting of Au/WN, Au/W/TiW and Au/Mo/TiW (elements on the left side are positioned uppermost with respect to the semiconductor substrate). In an ion milling technique used in that invention, etching is performed by bombarding a member to be etched with ions of an inert gas such as Ar or At+$O_2$ gas using a shower or beam type device. This technique is inert dry etching and is also called ion etching. This ion milling technique has been disclosed in, e.g., Solid State Tech. March 1983, Japanese Edition p. 51 to 62. In a reactive ion etching technique, by using a parallel-plate, microwave or ion-shower type device, dry etching is performed by reactive plasma using a reactive gas mixture such as $CF_4$+$O_2$ or $CF_4$+Cl while activating a member to be etched using an inert gas such as Ar gas.

U.S. Pat. No. 5,912,506 addresses perceived problems of
(a) thinning of additional metal layers crossing the edges of the multi-layer metal structure;
(b) shorts or pinholes formed in one or more insulator layers above multi-layer metal structure due to near vertical or undercut edges; and (c) controlling the effective width of the multi-layer structure when using an extended non-directional overetch.

These problems are variously addressed by the invention of that Patent. A multi-layer metal sandwich structure formed on a substrate includes a first metal layer formed on the substrate and a second metal layer formed on the first metal layer. The second metal layer has tapered side walls. The width of the first metal layer is different than the width of the second metal layer at the interface of the first metal layer and the second metal layer. The multi-layer metal sandwich may also include a third metal layer formed on the second metal layer. The second metal layer may also be substantially thicker than the first or third metal layers. A method for forming the multi-layer metal sandwich with taper and reduced etch bias on a substrate includes the steps of forming a three-layer sandwich of metal on the substrate by forming a first metal layer on the substrate, forming a second metal layer on the first metal layer, and forming a third metal layer on the second metal layer. A resist pattern is formed on the three-layer sandwich, wherein the resist pattern defines etch areas in the three-layer sandwich. The etch areas are exposed to a first etchant that taper etches the second metal layer while not attacking the first metal layer. The etch areas are then etched using a directional etch process, which etches the first metal layer. The resist pattern in then removed. The third metal layer may be removed. Preferably, the first metal layer is titanium (or a titanium alloy), the second metal layer is Aluminum (or an Aluminum alloy), and the third metal layer is Molybdenum (or Molybdenum alloy) or Copper (or a Copper alloy) or other refractory metal (or alloy). In this case, the first etching process for taper etching the aluminum second layer utilizes a wet etchant that is a mixture of phosphoric acid, nitric acid, acetic acid, and water, and the second etching process for etching the titanium first metal layer utilizes an RIE etching process.

Each of these references emphasizes the fact that each multiple layer element has its own unique properties and tends to require unique processing solutions and processing controls. It is desirable to be able to provide different multi-layer sandwiches with unique properties, both within individual layers and within the functional ability of the composite. However, each such different system requires fundamental investigation of the properties and the processing necessities.

A significant manufacturing problem in every form of printed circuit manufacture is the assurance of appropriate registration of the circuitry, and especially the connect points, in the layers of circuits that are combined. Each different system of manufacture has its own unique complexities in attempting to obtain registration, and each manufacturing process requires its own specific type of controls and steps to provide good registration. For example, even in stacking circuits by etching layers in place, there can be significant registration problems. Some circuits boards are manufactured by stack etching individual layers of circuitry by providing a base layer with a first metal layer and first resist layer. The resist is imagewise exposed and the metal layer etched in correspondence to the pattern provided to form a first circuit. A second metal layer (with an insulating layer interposed between the etched first metal layer circuit and the second metal layer) is placed over the first etched circuit with a second resist on the exterior surface of the second metal layer. A second circuit layer is formed by imagewise exposure, development and etching of the second metal layer. This sequence of metal layer application, resist development and etching is repeated for each of the layers of circuitry required in the complete patterning and design of the circuit board. Through holes, pins or vias are used to connect contact points or leads of the circuitry of the individual layers of etched metal to the appropriate circuitry in other layers (either adjacent layers or in layers separated by other layers of circuitry). For the manufacturer to connect the circuit elements and contact points with straight line holes or pins, it is necessary that the contact points be aligned vertically. If the contact points are not aligned vertically through the stacked array of circuits in the circuit board, the electrical connectors passing through the layers may not make the required contact with the circuit elements and the circuit board will be partially non-functional. The smaller and finer the elements of the circuit board, the higher must be the resolution of the circuit elements and the higher must be the degree of alignment for the layers in the circuit board.

Many different features and phenomena in each of the processes add to the uncertainty of registration. For example, in forming the stacked arrays by stacking circuits and by etching layers in place, registration can be compromised by a) temperature changes occurring during processing causing layers to thermally expand and then contract, distorting the circuit image, b) physical mislaying of layers on top of each other, c) misalignment of the stack within the exposure area of a photoresist imaging systems, d) vibration shifting either the circuit element or the imaging element (e.g., the laser diode for the imaging of the resist), and the like. In the development of new systems and processes for the manufacture of circuit boards, the nature of registration problems must be addressed early in the development cycle or severe problems will be encountered during scale-up. Another likely cause of misregistration e) is a volume change in adhesives during curing or setting.

SUMMARY OF THE INVENTION

A process for the etching of multiple layers of at least two different metals comprisies:

forming a resist pattern over a first layer of metal, said resist pattern having a pattern of openings therein, applying a first etch solution onto said resist pattern so that at least some etch solution contacts exposed areas of the first layer of metal, etching away the majority of the depth of the first metal in exposed areas of metal in the first layer of metal, applying a second etch solution onto the resist pattern the second etch solution having a rate of etch towards the first metal as compared to the first etch solution that is at least 20% less than the millimeter/minute rate of etch of the first etch solution at the same etch solution temperature, removing the second etch solution from said resist pattern after at least the first metal layer has been etched sufficiently to expose areas of a second metal layer underlying the first metal layer by forming an etched first metal layer, and applying a third etch solution to said etched first metal layer, the third etch solution having a fster rate of etch towards the second metal than towards the first metal to etch into said second metal layer without destroying theetched first metal layer.

The process may have the first and second etch solutions comprise at least one active ingredient in common between the two solutions, with the concentration of the common active ingredient being less than 75% the concentration in the second etch solution than in the first etch solution.

The process may have the second etch solution comprises a solution having a pH of at least 11.0 and an oxidizing agent. The process may have the second etch solution comprise a) an alkali metal hydroxide or an alkaline metal hydroxide and b) an oxidizing agent. A preferred process has the first metal layer comprise copper and the second metal layer comprise aluminum.

The process for the etching of at least connected metal layers may also have one layer comprise copper and another layer comprise aluminum, wherein the copper layer is etched with an acid solution and the aluminum layer is etched with a solution having a pH of at least 10.5 in the presence of an oxidizing agent. The process may have the oxidizing agent selected from the class consisting of metal salts of inorganic acids or organic acids, ferric salts of organic oxidizing acid, metal bromates, hydrogen peroxide, metal nitrates, metal nitrites, metal borates, metal phosphates, and ferricyanide salts.

A process allows the manufacture of circuitry from multi-layer metallic elements, the multi-layer metallic elements preferably comprising tri-metal subelements, such as copper/aluminum/copper sub-elements (hereinafter referred to as "tri-metal sub-elements," even though more than three layers may be present) which are created, as by etching, to form individual sub-elements of circuits. These individual sub-elements of circuitry are formed by multiple-step processing (e.g., multiple layer plating up or multiple layer plating down, lamination, or preferably by etching of tri-metal sub-elements). Intermediate or completed circuits are formed by the lamination of the formed (e.g., etched or partially etched), tri-metal sub-elements to a base intermediate layer (support or ground plane, for example), and then electrically connecting the appropriate points of the circuitry through intermediate layers to form the circuit board. These individual sub-elements are then electrically connected (e.g., with any electrical connecting means known in the art, including but not limited to posts, vias or plated through-holes) to form larger circuit elements. Circuitry may be formed by any method including the following, not necessarily sequential, steps of a) providing a multiplicity of the (preferably, tri-metal) sub-elements, b) providing a separator sub-element between the (preferably) tri-metal sub-elements, c) drilling, plating, inserting posts, or coating through-holes to electrically connect at least two of the (preferably) tri-metal sub-elements, d) providing a resist layer on at least one surface of at least one of the (preferably) tri-metal sub-elements, e) exposing or otherwise activating the resist (e.g., exposing a radiation sensitive resist to appropriate radiation in an image-wise pattern, thermally exposing a thermal resist in an image-wise pattern, printing on a resist in an image-wise pattern, etc.), f) developing the resist pattern to expose an underlying surface of at least one (preferably tri-metal) sub-element (of course, one resist layer can expose only one underlying tri-metal sub-element at a time), g) etching at least one layer of the tri-metal sub-element through openings in the developed resist layer, and h) stripping the resist from the surface. After the first layer has been etched, the next layer (the preferably aluminum layer) may be etched, with the copper layer remaining as at least part of a resist surface. The remaining copper, after the second or third etch, may be coated with an organic solderability preservative (as that class of composition, often including rosin, is known in the art) or metallized, such as silvered to increase its solderability and/or conductivity. By this method, not only may conventional circuits be manufactured, but air bridges may also be constructed within the flow of process steps. The second exterior metal layer (e.g., the second copper layer) may be etched before or at the same time as the first metal layer (first copper layer), after the etching of the first layer but before etching of the interior aluminum layer, or after the etching of the first metal layer but after etching of the aluminum layer. Solder mask may be added at any of various stages of the process for the purpose of electrical insulation, underfilling of air bridges and encapsulation of cores, edges and traces, etc. Flexible, rigid, and segmented flexible and rigid (rigid-flex) circuit boards may be manufactured by the selection of appropriate layer thicknesses and support layer materials.

As the individual layers of circuit elements must be interconnected on the circuit board, it is desirable or even essential that a sufficient degree of registration is effected between each of the layers to be connected. This is difficult enough where only two (e.g., tri-metal) sub-elements are connected on opposite sides of a support, but the difficulty is magnified with more layers or when sheets of (preferably tri-metal) material are used from rolls or coils, and the lamination of the (e.g., etched tri-metal) sub-elements occurs in a continuous fashion. In the last process, misregistration can readily creep and increase in the layers as they are laminated due to the multiplying effect of slightly misregistered panels or circuits in coil or roll form. Rather than losing a single circuit board in that circumstance, an entire run of circuit boards could be lost. As part of the process of this invention, numerous points of registration can be integrated into the system by providing registration marks, using through holes as registration marks, optical feedback mechanisms, electrical connection checks during manufacture, registration marks in the original coils or rolls, registration marks added to the coils or rolls during the etching step, mechanical registration elements built or processed into the coils or rolls during processing or at the time of the original supply. Multiple numbers of etched tri-metal subelements also may be directly laminated together without intermediate supports or ground plane layers. This would be accomplished by applying adhesive to an outer surface (or remaining outer surface) of the etched tri-metal subelements. The adhesive would be a dielectric for best performance of the bonded multiple tri-metal subelements without an intervening distinct layer.

DETAILED DESCRIPTION OF THE INVENTION

Figure 1:
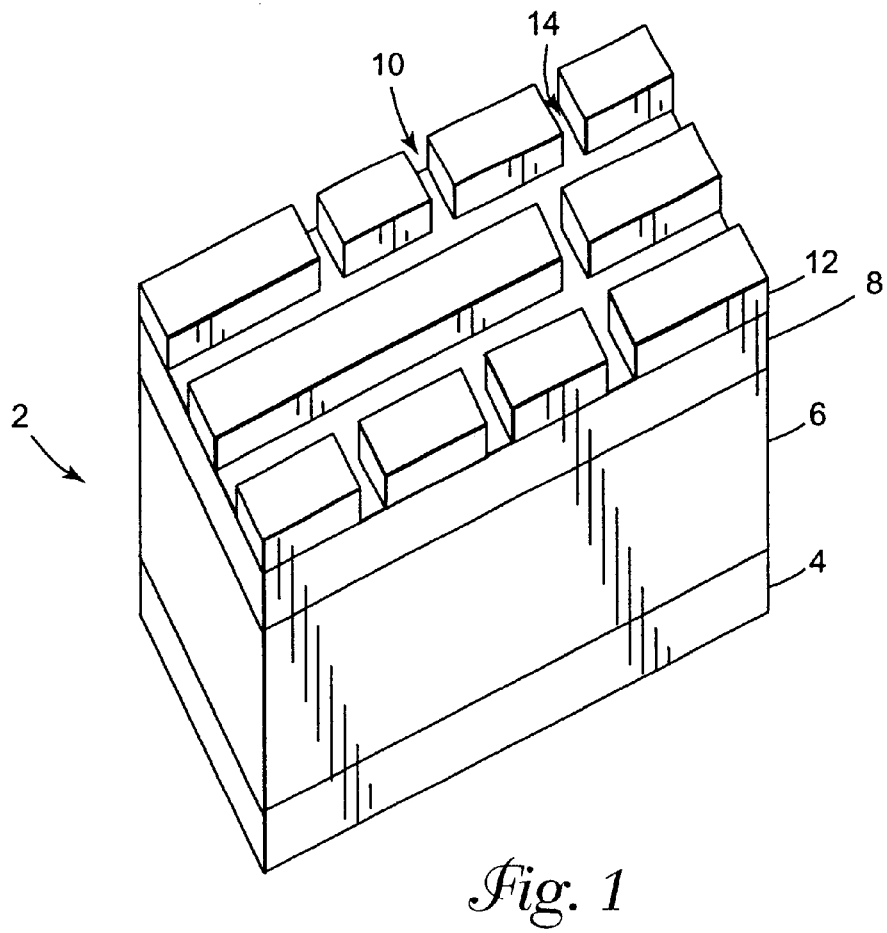
FIG. 1 shows a perspective view of a tri-metal subelement with an imaged and developed resist layer on the upper surface of the element.

The etching of details into metal layers can be a complex and difficult task. The complexity and difficulty varies greatly between emtal layer systems depending upon the number of metal layers, the types of metal layers, the resolution required in the etching process, and other aspects of the materials and constructions used. In the etching of circuit layers for use in electronic circuitry, such as layers or composites for use in circuit boards, the process and materials used have high required standards of performance. In the present invention we particularly describe etching of metal layers, partoicularly where one of the metal layers comprises aluminum or an aluminum alloy, and particularly an aluminum layer in galvanic contact with a copper layer (also including copper alloy layers). The present invention describes several methods for etching copper layers in the presence of aluminum alloys and aluminum in the presence of copper metal or alloys and etching aluminum layers in the presence of copper layers.

In the etching of electrical circuits, it is an advantage to be able to resolve the smallest possible lines and spaces for any given material thickness. It is also essential that the combination of material system and process be extremely reliable, so as to avoid creating even a single short circuit or open circuit that would make the composite circuit useless. Chemical systems are described herein that are capable of being used with commercially available photoresists and which operate at reaction rates that are commercially viable at dimensional tolerances that are useful for current and advanced circuits.

A process for etching the copper-aluminum-copper tri-metal is described hereoin as an example of the present invention. At least one of the copper layers is coated with a photoresist, which is then exposed and developed to remove some of the resist and leave a pattern of exposed copper. When the exposed pattern is etched, the desired electrical circuit pattern is created in an outer copper layer. Often in a tri-metal composite, both of the outer copper layers are resist layer coated, exposed and etched at the same time. Etching of the copper layer(s) is accomplished with one or more of several etching systems described later, which have a pH that is less than 10, and the aluminum layer(s) are etched with a solution having a pH greater than 10.5, and preferably significantly greater than 11.

Following etching of at least one of the copper layers, the remaining photoresist is stripped away and the electrical circuit is bonded to a support layer such as a ground plane or a dielectric layer by an adhesive to secure the etched copper layer to the support layer. Alternatively, after etching the first copper layer, the central aluminum layer could be etched prior to the bonding of the copper circuit. After bonding to the support layer, the remaining copper circuit could be coated, exposed, developed and etched. The circuit could be bonded to many different types of substrate configurations, consisting of circuits, dielectric coated electrical ground planes, insulators or carriers, such as epoxy coated steel or aluminum. The adhesive may be applied first to the support layer or to the surface of the etche copper, or may be provided as a coating layer on the support layer as a stock or in-manufacture coating layer.

In etching the aluminum central layer, one of the copper circuit layers often serves as a 'metal-as-mask' resist, which is used to protect certain portions of the (e.g., aluminum) core from subsequent etching. Alternatively, the etched copper circuit could be coated, exposed and developed with a resist that is able to withstand the etchant(s) used to etch the central aluminum material. Etching of the aluminum layer is accomplished using one or more of the etchants described below. Each of these etchants has a pH greater than 10.5

Etching of the Copper Layers

The etching systems of mpost particular interest for copper in this application give a favorable etch factor (high ratio of depth to undercut width), excellent dimensional control and no attack on aluminum. The etch rate is fast enough for good manufacturing through put, but is controlled to avoid excessive etching of desired features while etching difficult features (such as intermetallics), using more etch resistant compositions or completing very small lines and spaces.

Of special interest is the effect of the copper etchant on an aluminum surface when all the copper in specific design areas (or a desired amount or thickness of copper) has been etched away. It is desirable that the copper etchant, where used to remove the last traces of copper, not be an aggressive etchant for aluminum (this is especially important since the anodic potential of copper in contact with aluminum makes etching more difficult). Such final copper etchants may be different from the etchants used to attack the outer, non-aluminum exposed or coated regions of the copper. For this reason, the process may often use a strong etchant which gives an excellent etch profile to etch the top 50 to 75% or 50 to 95% of the copper thickness (with some copper completely etched through, exposing underlying aluminum) and then the process is switched to a second and different copper etchant, which second etchant does not vigorously attack aluminum, to etch down through the copper to the aluminum interface. A table at the end of this text illustrates that a combination of copper etchants can be used to accomplish this task.

In addition to the etch chemistries disclosed here, it has been found that the addition of high concentrations of aluminum ions into the etch solution system for the copper will reduce the tendency for aluminum to be attacked when etching copper (LeChatlier principle).

The underlying process used in the manufacture of circuit boards according to the present invention comprises the steps of providing a subelement, preferably a tri-metal sub-element, etching two exterior surfaces of the tri-metal sub-element to form electrical circuit patterns, etching an interior metal layer to provide at least physical connection between the two etched exterior surfaces, attaching one or more etched tri-metal sub-elements to at least one support (including an insulating or conducting support), and electrically interconnecting the etched multiple tri-metal sub-elements to form a circuit board. One or more etched tri-metal subelements may be electrically connected to an insulating support, a ground plane or other conductive support. It is clearly explained herein, but emphasized here, that the above steps do not have to be performed in the specific order in which they have just been presented. For example, one exterior layer and the interior layer may be etched, the etched exterior layer bonded to the support, and then the second exterior layer is etched. The process also allows for the tri-metal sub-element to be provided as a fed sheet or unrolled coil or roll of material, both before etching and even after etching of the sheet of material. Working within this general process, the specific points where alignment becomes important include at least:

1) aligning the circuit design of each opposed exterior layer in each of the tri-metal sub-elements;
2) alignment of pairs of etched tri-metal sub-elements on opposed sides of the support layer;
3) alignment of each etched tri-metal sub-element with the edges of the support or through holes, vias, blind vias, connector openings, machined or routed areas, etched areas, or pins on the support;
4) alignment of the width and length of sheets of tri-metal sub-element stock material fed into the production path; and 5) alignment of the holes, connector openings, machined, routed or etched areas, or other features embedded into the adhesive, dielectric or dielectric adhesive.

Each of these critical points of registration must be addressed in the process for the most efficient and effective performance of the process.

The process of the present invention generally comprises a process for the formation of an article having multiple electrical circuits, the process comprising:

providing a first sub-element comprising a first metal layer in electrical contact with a second metal layer in turn in electrical contact with a third metal layer;

etching an electrical circuit design in the first metal layer so that at least one circuit element in the form of a pattern of elements is formed and in a separate etch step, etching away at least 10%, but less than 100% of the second metal layer to provide physical, thermal and/or electrical connections between the first metal layer and the third metal layer;

etching an electrical circuit design into the third metal layer;

adhering an etched surface comprising the circuit design of the first metal layer to a support layer to form a circuit board;

wherein adhering the etched surface is performed with at least one element of the pattern being positioned in registry with a physical or an electrical element associated with the support and then the etched surface is adhered to a first surface of the support while registry is maintained between the at least one element in the form of a pattern of elements and the electrical element associated with the support. The process may provide the electrical element associated with the support as any form of convenient electrical connector, for example, an electrical connector selected from the group consisting of a through hole, vias, blind vias, pin or plated hole. The process may also provide an electrical element associated with the support as a circuit element on a second surface of the support. The electrical elements, physical elements or non-electrical elements may be associated with the support as a second circuit sub-element or feature on a second surface of the support. The circuit sub-element may comprise, for example, a three layer circuit pattern of two similar metals bridged by a second metal that is different from the first metal(s). Preferably the first metal(s) comprise copper and the second metal comprises aluminum, and the first sub-element is fed into the process from a roll of sheet material comprising the first sub-element. To facilitate registration, a mechanism for the effecting of registration, such as registration marks (and other elements later described herein, with the term "registration marks" being used generically to represent physical visually and mechanically readable markings, printing etchings, grooves, alignment holes, physical mating elements, and the like) may be present on both the roll of sheet material and the support, and the registration marks on both the roll of sheet material and the support are (visually, electronically, and/or mechanically) sensed to provide information on the position of the registration marks, and the information on the position of the registration marks is used to identify the relative position of at least one element on the roll of sheet material with respect to at least one element associated with the support that are intended to be in registration with each other. The use of the information on the position of the registration marks provides information that the marks are not in registration, and a control on the system (either automated by computer direction or manually administered by an operator) alters a positional variable in at least one of the roll of sheet material, sheet material being fed from the roll of sheet material, or the support to move the registration marks into closer alignment. The positional variables for alignment encompasses any relative position (any of the three dimensions [up-down, left-right, forward-back], and rotational aspects [the planes of the two materials angled away from each other, or twisted away from each other, or askew from each other] between the at least two layers or materials), particularly those selected from the group consisting of forward position and lateral position. The process may provide a series of registration marks along a length of the sheet material, and when any necessary positional variable is altered based upon information from a first set of registration marks on layers to be assured of alignment and registry (e.g., both the sheet material and the support), that alteration moves a subsequent set of registration marks into closer alignment than were the first set of registration marks. Where registration marks are read before contacting of the layers, the layers may be moved into registration with respect to the regions where the first set of registration marks are present. The registration marks may be read on the sheet material before the sheet material is unwound from the roll, or after the sheet material is unwound from the roll and before contact with other layers, or after being unrolled from the coil(s) and after contact and/or lamination to any other layer(s). Examples of registration marks are sets of registration marks selected from the group consisting of mechanical elements that mate with receptors on an opposed surface, mechanically readable marks on at least one surface of each the sheet material and the support, magnetically readable marks, reflective readable marks, fluorescent readable marks, and any other form of mechanically readable or visually readable mark that has been etched, drilled, printed, molded, laminated, fused, stamped, built or punched on at least one surface of the sheet material and a mechanically readable or visually readable mark on the support. As noted above and elsewhere herein, mechanical alignments (not mechanically readable alignments) such as posts and hole sets, groove and ridge sets, post and gate sets, and the like may be used to form physical alignment sets in which physical features on one surface are physically aligned or mated or matched with physical features on adjacent layers.

The altering of a positional variable is preferably performed without embedding tension between the support and the etched surface that would shear any features on the etched surface. If the change in relative position between the two layers creates an internal stress (e.g., when an elastically stressed or stretched layer is laminated to an unstressed or unstretched layer), release of the externally applied tension after the layers have been laminated or otherwise joined will leave the stress between the layers within the finished article, and there could be a shearing stress within the article of sufficient strength to damage elements of the circuitry, particularly smaller, fragile elements of the circuitry, such as air bridges, or create alignment issues. The process may therefore include measuring tension in both the sheet material and the support, and the tension is maintained on both layers so that there is no excessive differential elastic elongation of the two layers that differs by more than 1% during the application of tension to both layers when said etched surface is adhered to a first surface of the support.

The following general types of registration practices may be performed, with appropriate selection of the equipment and materials used to perform the task. Original readable marking(s) may be provided on the tri-metal sub-element (or any other layer, such as the support layer, ground plane, etc., for each of these alternatives), the etch process for a layer may include a pattern that provides a readable marking(s) on the tri-metal sub-element, or a natural portion of the etch pattern of the circuitry may be used as a readable marking(s) on the etched tri-metal sub-element. An artifact, including even an etched through hole, may be used to sense the position of one or more layers or stacks or elements or sub-elements. For example, when laminating two separate etched tri-metal sub-elements to a ground plane, light (especially collimated of focussed light) may be directed at the through holes. If light is received through all of the sub-elements, there is alignment of at least that series of through holes. Special alignment openings for use in the alignment process may also be provided.

One method of adjusting the registration of different segments of circuitry on a sheet of unrolled or fed tri-metal subelements is to provide crimps or partial folds between different segment areas. In this manner, as misregistration is noted, reregistration may be effected by additional tension (or even less tension) on the fed strip, as this would alter the positioning of the segment and registration holes by stretching the crimp (or by not stretching out the crimp as much as the normal tension accomplishes). The change in pressure may be provided by tension provided on the sheet by controlled nip rollers or other transporting means that can alter the tension on the sheet or realign the sheet. Where two pairs of nip rollers on the edges of the advancing sheets are provided, altering the tension of one edge more than another edge will also adjust angular directions (side slippage) in the advancing sheet and not merely longitudinal alignment issues.

The manufacture of circuit boards has become a highly competitive field, with circuit boards being needed in essentially all modren electrical appliances and games, yet with their individual design having to be tailored for each field of use, their production having to be rapid and cost efficient, the volume capacity being extremely large, and the requirements for quality being absolute since failure of the circuitry will render each product useless. It is therefore desirable to find high through-put systems with maximum amounts of automated features, using stock materials, and integrated systems to provide durable electrical circuits capable of supporting high density circuits with large amounts of flexibility in application and use of the circuitry. These circuits should be able to endure and conduct away significant amounts of heat energy (which is likely to be developed or generated during use of the circuits), which can operate across a wide degree of environmental conditions (such as temperature, humidity and atmospheric pollution conditions that might be experienced by automobiles), and endure significant physical stress in use and installation. The system should also be capable of offering flexible manufacturing capabilities and provide circuits with a wide range of versatility in end use electrical fields. One aspect of the present invention that addresses the manufacturing volume issue is the use of a method of forming a multiple layer circuit board comprising the steps of providing at least two subelements having at least one complete layer of circuitry on each of the subelements, each of the subelements having registration elements thereon, reading and comparing the relative registration of the marks on each of the subelements, and adjusting the registration between the subelements before the subelements are adhered together, then adhering the subelements together. The use of this type of coil or roll fed sheets of circuit elements, either before complete formation of the individual layers of elements or after completion of each layer of circuit(s), and their lamination in a roll-fed system advances the volume capability of the industry. The subelements are preferably provided in a roll comprising more than two subcircuitry designs already formed on each sheet (e.g., one circuit element being a first exterior metal layer in tri-metal layer and a second subcircuit being another exterior etched metal layer in the tri-metal subelement. The method may include where registration is read mechanically, with electrical signals provided by the mechanical reading, and the electrical signals are sent to a computer that compares the signals to analyze for registration.

The fundamental electrical sub-element of the present invention comprises a tri-metal based circuit, especially a copper-aluminum-copper tri-metal subelement. It is to be understood that the terms copper and aluminum include mixtures, blends, solid state solutions, and alloys of these elements. Although the present description will focus on the use of the highly preferred copper-aluminum-copper tri-metal element, other combinations of materials may be used within certain practices of the described invention, and both general comments and comments specific to the copper-aluminum-copper systems with regard to processes and structures may be applicable to other tri-metal or multiple metal/multiple layer systems, as will be recognized by those skilled in the art. The copper-aluminum-copper systems provide significant and preferred benefits, but the entire scope of the invention is not necessarily limited thereto.

The tri-metal sub-elements are commercially available or may be manufactured by various different systems. The tri-metal sub-elements should be provided with the metal layers having the individual and composite thicknesses desired for the intended ultimate use of the circuitry. The thickness of the various layers may vary from about 0.1 mil (0.0025 mm) to 200 mils (5.1 mm) for the (external most) copper layers to about 0.1 (0.0025 mm) to 400 mils (10.2 mm) for the interior metal (aluminum) layer in the tri-metal system. Preferred dimensions are consistent with the dimensions common to electrical circuits in common use, such as from about 0.5 mil (0.0126 mm) to 100 mils (2.54 mm) or 1.0 mil (0.0254 mm) to 7.50 mils (2.5 mm) for the (external most) copper, layers to about 0.1 (0.0025 mm) to 100 mils, (2.54 mm) or 1.0 (0.025 mm) to 75 mils (1.9 mm) for the interior metal (aluminum) layer in the tri-metal system. With very thick circuits within the range of circuits described above, it might be desirable to do some rough or preliminary mechanical machining to more rapidly remove metal and then follow the preliminary mechanical machining with more detailed chemical etching. The tri-metal sub-element may be manufactured, for example, by plating (electrical plating, electroless, bath plating, surface reduction plating, etc.), cladding, vapor deposition, lamination, or any other process that provides the necessary layers with sufficient bonding strength, uniformity of layer thicknesses and surface smoothness desired or the practice of electrical circuit manufacture. From a cost-effective standpoint only, cladding and plating are the preferred methods of providing the copper-aluminum-copper systems, and cladding is the more preferred method of providing the tri-metal sub-element. When we refer to copper-aluminum-copper systems in the practice of the present invention, that term allows for the presence of either or both internal, intermediate and/or external layers of other materials, such as, for example, artifact layers (e.g., segments of zincated layers, adhesive layers, etc.) from the process of making the tri-metal system. A preferred range of useful size ranges would comprise a tri-metal subelement having 1–5 mil exterior copper layers, 4–10 mil interior aluminum layers, and a support layer comprising 2–10 mil copper core, 0.5 to 3 mil epoxy coatings on both sides of the core, and a dielectric adhesive of 1 to 4 mils. If the dielectric adhesive can be coated directly onto the core, that dielectric adhesive layer would preferably have a thickness of from 1 to 10 mils.

One process according to the present invention for the formation of an article having multiple electrical circuits, the process comprising:

provide a first sub-element comprising in sequence a first metal layer in electrical contact with a second metal layer in electrical contact with a third metal layer;

etching an electrical circuit design in said first metal layer and in a separate etch step, etching away at least 10%, but less than 100% of the second metal layer with an etchant solution having a pH of greater than 10 and comprising an oxidizing agent to provide electrical connections between said first metal layer and said third metal layer;

etching an electrical circuit design into the third metal layer;

adhering an etched surface comprising the circuit design of the first or third metal layer to a support layer to form a circuit board. Preferably, the first metal layer comprises copper and the second metal layer comprises aluminum. More preferably the third metal layer comprises copper. The preferred etchant solution having a pH of greater than 10 comprises a strong hydroxide, such as an alkali metal or alkaline metal hydroxide, including, but not limited to Group I or II metals such as sodium hydroxide, potassium hydroxide, lithium hydroxide, calcium hydroxide, strontium hydroxide, magnesium hydroxide, and the like. The preferred oxidizing agent is selected from the group consisting of strong oxidizing agents, particularly inorganic or organic oxidizing agents and metal salts of inorganic acids or organic acids, such as ferric oxalate (or other ferric organic oxidizing acids), ferric citrate, sodium bromate, hydrogen peroxide, sodium nitrate, sodium (or other metal) nitrite, metal borates, sodium (or other metal) phosphate, and ferricyanide salts. Any salt of an acid that displays a higher solubility for aluminum than for copper would be particularly desirable. The oxidizing agent must be able to oxidize Al metal to $Al^{-3}$ to be effective, with borates and boraxes being among the weakest oxidizing agents useful. Substantially any metal may be used as the cation in these compounds, with ferric, sodium, lithium, potassium, magnesium, calcium, zinc, and the like being more preferred. The range of weight for use of the hydroxides will usually be within the range of 100–400 g/L for sodium hydroxide (or about 2 to 10 mol/liter hydroxyl content). The range used for sodium nitrate is about 20 to 170 g/L for the oxidizing agent (this is about 0.2 to about 2 mol/liter oxidizing agent). The most important aspect of the use of the hydroxide materials is to maintain the desired pH of greater than 10.5, which can be achieved with lower concentrations of stronger caustic materials. Similarly, for the oxidizing agents, smaller concentrations of strong oxidizing agents may be used, as with less than 50 to more than 400 g/liter (or, for example, from 0.05 to 4 M).

The etch solution for the etching of the internal metal layer (preferably the aluminum layer) according to an improved practice of the present invention should have a pH of at least 10, and should be highly caustic in combination with the oxidizing agent. It is preferred that the solution have a pH of greater than 11, greater than 12, greater than 13 and even may be greater than 13.5 or 14, with as much as 300 g/L or more of sodium hydroxide or other alkali or alkaline metal hydroxide (in combination with an oxidizing agent) being a preferred type of etch composition. The etch solution for the exterior metal layer (e.g., the copper layer) is usually an etchant solution with a pH less than 10, usually less than 9.5, often within the range of 6–9, and may be a lower pH, also with an oxidizing agent preferably present. Such etchant solutions may comprise cupric chloride, ammoniacal chloride, ammonium carbonate, ammonium persulfate, ferric chloride, cupric sulfate, hydrogen peroxide, ammonium bisulfate, chromic acid/sulfuric acid blends (with or without initial amounts of copper ions present), and the like. One preferred practice is to use a strong etchant for the copper that may have some etching ability for the aluminum (e.g., cupric chloride), etching down until the aluminum is just exposed by the etch or a slight amount of aluminum is etched (which is acceptable, since the exposed aluminum is to be at least vertically etched), and then replacing the first etch solution with an etch solution that is still active towards the copper, but less active towards the aluminum, such as a solution of sulfuric acid and hydrogen peroxide. The etchant solutions for the various layers may be applied at various temperatures and pressure (spraying pressure) conditions. For example, etch solutions for the copper (e.g., a depth etch solution of $CuCl_2$ (140 to 230 gCu/L) and HCl (0.4 to 5.5 moles/L) and a final etch solution of $CuSO_4$ (15 to 70 gCu/L), sulfuric acid (10 to 30% by weight) and $H_2O_2$ (7 to 16% by weight) may be used at temperatures above 100° F., for example between 105 and 140° F.

The etching systems of interest for copper in this application give a favorable etch factor (high ratio of depth to undercut width), excellent dimensional control and no attack on aluminum. The etch rate should be fast enough for good through put, but controlled to avoid excessive etching of desired features occurs while the etching of difficult features, such as intermetallics, more etch resistant compositions or very small lines and spaces is completed.

Of special interest is the effect of the copper etchant on the aluminum surface when all the copper has been etched away. It is essential that the copper etchant, used to remove the last traces of copper not be an aggressive etchant for aluminum (this is especially important since the anodic potential of copper in contact with aluminum makes etching more difficult. Such final copper etchants may be different from the etchants used to attack the outer, non-aluminum coated regions of the copper. For this reason, we often use a strong etchant which gives an excellent etch profile to etch the top 50 to 75% of the copper thickness and then switch to a different copper etchant, which does not vigorously attack aluminum to etch down to the aluminum interface. The table below illustrates that a combination of copper etchants can be used to accomplish this task.

In addition to the etch chemistries disclosed here, we identify that the addition of high concentrations of aluminum ions in the etch system will reduce the tendency for aluminum to be attacked when etching copper (LeChatlier principle), e.g., at least 30 g/L of aluminum in the solution, with amounts of up to 200 to 300 g/L being particularly effective.

| Etchant | Etch factor | Etch system | Al attack |
| --- | --- | --- | --- |
| Ammonium per sulfate | | Immersion or spray | |
| Cupric chloride | Very good | | Aggressive |

-continued

| Etchant | Etch factor | Etch system | Al attack |
|---|---|---|---|
| HCl Metal (e.g., Ferric) chloride HCl | Very good | | Aggressive |
| Ammoniacal NH$_4$Cl,OH,CO$_2$ | Best | | Redeposits Cu on Al, requiring additional etch |
| H$_2$SO$_4$—H$_2$O$_2$ | Poor | | Slow to none |
| Chromic-sulfuric acid | Poor | | Slow to none |

The tri-metal sub-element(s) are attaached to a substrate using an adhesive in a lamination process. Lamination conditions may also vary, dependent in part upon the specific materials used, but some generalizations may be provided. Pressure between layers being brought together should exceed at least about 20 pounds per square inch gauge (psig). Where a thermally activatable adhesive such as Z-Flex Adhesive at a thickness of between 1 and 4 mils, a pressure of at least 30 psig (e.g., from 30 to 100 psig, preferably between 60 and 90 psig) and a temperature above 100° F., preferably above 150° F., and preferably between 180° and 380° F. may be used. The use of an autoclave, with vacuum lamination, is prefered in this step.

Aluminum Etching

The controlled etching of the center layer of the tri-metal produces conductive posts which connect certain portions of the outer copper circuit elements. In most cases the etched aluminum pattern is controlled by the size of features of the upper or lower copper circuit. The size of the copper feature that is required to produce an aluminum feature in the center layer depends on the thickness of the copper and aluminum and the type of aluminum etchant used. Alternatively, a photoresist layer could be applied and developed to pattern the aluminum layer. This could prove difficult, however, as most commercial photoresists are removed when exposed to etchants that have a pH in excess of 10.5, that are used to etch the aluminum layer.

The aluminum layer etching should be well controlled to avoid over etching aluminum posts, which would result in opens or poorly supported 'air bridges'. Uneven aluminum thickness or non-uniform etching of the copper or aluminum can result in undesired aluminum features remaining, which could result in electrical shorts.

We have used several different chemistries for etching aluminum and have worked with both immersion and spray processes. It is important to select a chemistry and exposure method (time, temperature and etchant delivery system) that controls the strongly exothermic reactions that occur when aluminum is etched. Failure to control etch temperature can damage both the circuit being etched and the equipment which contains the etchant.

The chemicals used to etch aluminum have a strong influence on the rate of etching, the surface finish and the degree of undercut of the etched aluminum features. We have selected etchants that do not substantially etch the copper circuits, but some of these chemicals do produce a substantial oxide film on the copper which must be removed, especially from areas where electrical connectors or electronic devices are attached.

Our initial work with potassium ferricyanide etchants produced smooth, well controlled features, but required long etch times. The use of NaOH in various concentrations did not result in a well controlled process until we added oxidizing agents and especially preferred oxidizing agents, as described herein, and buffered the system within the preferred pH range, using conventional buffering materials and systems. We believe that the use of various highly concentrated solutions in a copper-aluminum-copper circuitry, gives excellent results and has not been previously reduced to commercial practice.

Some of the oxidizers that enhance the performance of the high pH etch system, for example sodium nitrate and especially sodium bromate, are both expensive and environmentally unfriendly. In addition to the use of these additions, we propose novel methods for the recovery and re-use of these materials, which reduces both cost for bath preparation and waste disposal.

| Description of Various Aluminum Etching Systems for ETM | | |
|---|---|---|
| Etchant | Concentration and pH | Delivery method |
| Ferricyanide | 100 g/l and pH 12 | Spray or immersion |
| NaOH and NaBrO$_3$ | 300 g/l 50 g/l | Spray and immersion |
| NaOH and NaNO$_3$ NaNO$_2$ | 300 g/l 105 g/l 100 g/l | Spray Spray |

The etch was smooth and controlled with each of these types of etch materials.

FIG. 1 shows a tri-metal subelement 2 according to one aspect of the present invention. A first metal layer 4 (copper) is formed, optionally on a supporting substrate or on a substrate not shown, (acting as the ground plane, e.g., copper). The first metal layer 4 is copper metal that adheres well to the aluminum substrate 6. The first metal layer 4 may be formed onto the aluminum substrate 6 by any convenient manufacturing process, for example, sputter depositing the copper, co-extruding the copper (with the aluminum layer 6), chemical deposition, electroless deposition, cladding, plating, laminating, etc. The first metal layer 4 preferably has a thickness of between about 1 to 500 micrometers. The copper layer 4 is shown with the adjacent aluminum layer 6 and a top-most (in this Figure) second copper layer 8. The aluminum layer 6 may have a thickness, for example, of between 5 and 1000 micrometers. The second copper layer 8 may have a thickness in the same range as the first copper layer 4, although it does not have to be the same, identical thickness. Next, as shown in FIG. 1, a first resist pattern 10 is formed on the resist layer 12 over the third metal layer 8 exposing an etch area 14 (i.e., an area to be etched) on the surface of the third metal (copper) layer 8.

The etch area 14 exposed by the resist pattern 10 is then subjected to a wet etch solution that etches the third metal layer 8 faster than the second metal layer 6, while either not attacking the first metal layer 4 (which would be protected against contact with the etch solution by being covered or separated) or etching a pattern (not shown) on a separate resist layer (not shown) over the surface of the first metal layer 4. Because the third metal layer 8 etches at least faster than the second metal layer 6 (which may not be significantly etched at all in this step, and is preferably not etched during this step, as by substantial no change in the surface or removal of substantive amounts of materials, e.g., more than),5 mm thickness, by this etch step), there is no adverse effect on the structure or performance of the second metal layer 6. The first etching process preferably utilizes a wet etchant that is a mixture of various ingredients more specifically defined later herein, such as inorganic acids, organic acids, water, buffers, etc., such as phosphoric acid, nitric acid, acetic acid, and water. A more detailed description of the formation of a taper angle of the second metal layer 8 may be found in W. Kern et al., "Improved Reliability of Electron Devices Through Optimized Coverage of Surface Topography," 11th Annual Proceedings Reliability Physics, 1973, pp. 214–223, herein incorporated by reference in its entirety.

The etch areas 10 exposed by the resist pattern is then exposed to a second etching process which etches the second metal layer 6 (e.g., of aluminum), but which does not attack the first and third metal layers 4 and 8 (e.g., of copper). Moreover, the second etching process controls and preferably minimizes the lateral etching of the third metal layer 8 with respect to the patterned resist layer 12. The second etching process may utilize a chlorine based directional RIE etch process, which is described in more detail in T. P. Chow et al., "Dry Etching for Microelectronics," Elsevier Pub., N.Y., 1984, Chapter a hereinafter incorporated by reference in its entirety. Alternatively, other directional etching techniques may be used, such as ion milling. When there is no support layer present against the first metal layer 4, the first metal layer 4 (also of copper) may also be etched to complete that particular sub-element 2 section of the printed circuit. By properly designing and etching each of the copper layers 4 and 8 (before complete etch through and finishing of etch with the aluminum layer 6), and by properly designing the structure of the aluminum remaining between the two copper layers, the circuit sub-element will have two distinct layers of copper circuit connected by the aluminum post elements remaining after the etch. As noted, the conductivity of the posts may be enhanced by the silvering of the posts if needed. Additionally, posts may be positioned in through-holes between each tri-metal sub-element (or other layers designed for the circuit board), being connected through the ground plane(s), with the through-holes themselves being plated to provide conductivity between the layers and tri-metal sub-elements, alone or in combination with posts. Finally, the resist pattern 9 is removed. The resulting structure is a tri-layer metal layer formed on the substrate. This aspect of the invention is better displayed in FIG. 2.

Figure 2:
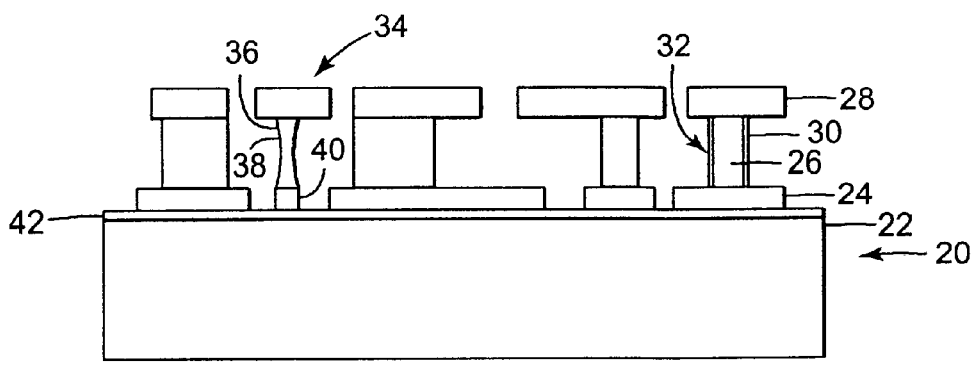
FIG. 2 shows a side view of a circuit board formed from one tri-metal sub-element exposed and developed according to the present invention.

In FIG. 2, a completed circuit element 20 is shown. The element comprises the ground plane 22 (e.g., comprising a metal, preferably a highly electrically and thermally conductive metal, such as copper), a first etched metal layer 24 (comprising for example, copper, as this could be layer 8 from FIG. 1), a second etched metal layer 26 (e.g., aluminum as this could be the counterpart to layer 6 in FIG. 1), and a third etched metal layer 28 (this could be the counterpart to layer 4 of FIG. 1). Also shown is that one pin 32 connecting circuits formed by layer 24 and layer 28 has been silvered, forming a silver coating 30 on the exterior of the pin 32. As can be seen, the effective circuitry formed does not require identical sizes, shapes or even thicknesses between the segments in layers 24 and 28. Also to be noted is the contour and variables that may occur in the structure as represented by the circuit connection 34. The intermediate metal layer (e.g., aluminum) 36 appears relatively narrow because of the narrowness of the first originally etched layer 40. In addition to the narrowness of the bridging element 36, the natural limitations and phenomena of etching intermediate layers (such as the middle, second metal layer 4 of FIG. 1) causes artifacts on the material, such as the bowed or undercut sides 38 shown in the bridging element 36. As more than 70%, usually more than 75%, and preferably more than 80%, more than 85% and even up to 90% or 95% of the middle layer (e.g., aluminum) is etched away in the second etching step, or whatever sequence etching step is used to etch away sections of this second metal layer (6 in FIG. 1), not only are such side structural appearances likely, there may even be the possibility of complete removal of all middle metal layer between the first and third metal layers (4 and 8 in FIG. 1). Where the remaining outermost metal layer 28 (4 in FIG. 1) is also relatively thin, this may enable the formation of air bridges, as better shown in FIG. 3.

Figure 3B:
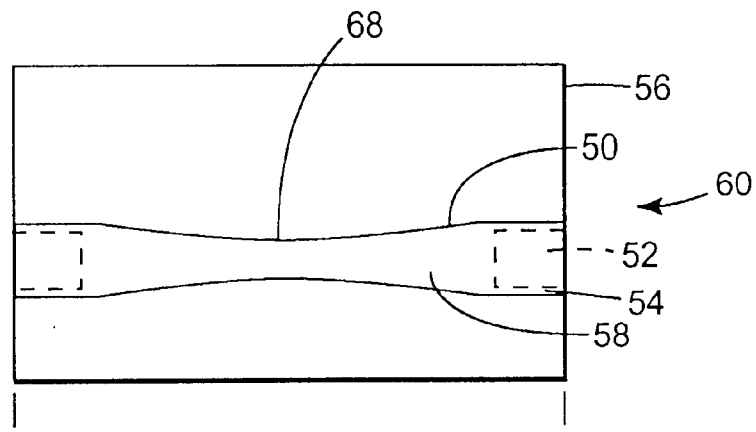
FIGS. 3a and 3b show various perspectives and views of a filled and protected air bridge formed according to a practice of the present invention.
Figure 3A:
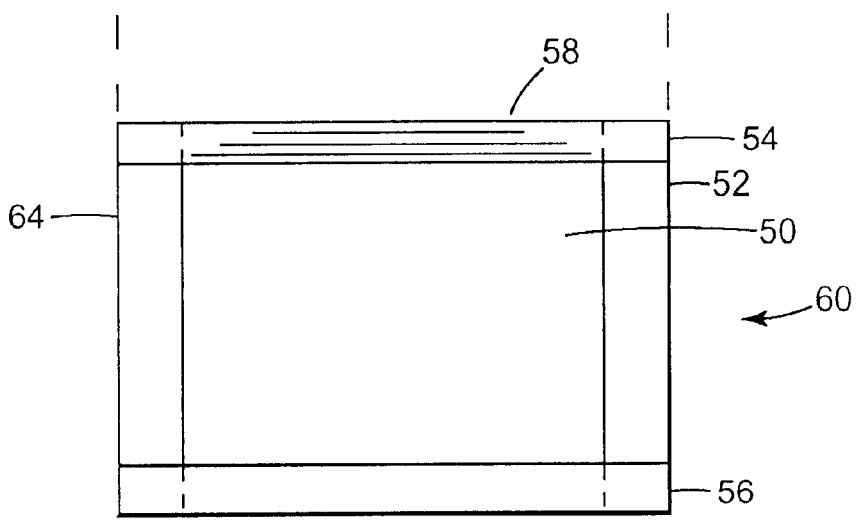

FIG. 3 shows two views a and b of an air bridge 50 in the section of circuitry 60. FIG. 3a thus shows a section of circuitry 60 that comprises a structure referred to in the art as an air bridge 50. The air bridge 50 comprises the remaining segments of etched first and third metal layers 56 and 54, respectively, side walls or posts 52 and 64 remaining from the etching of the second metal layer (e.g., the aluminum of layer 6 of FIG. 1), and the air space or void 60 within the air bridge 50. The residue circuit segment 58 of the third metal layer is indicated as being relatively thin, which is shown to better advantage in FIG. 3a.

FIG. 3b shows the section of circuitry 60 with the air bridge 50 with the image of FIG. 3a rotated 90 degrees. Each of the layers and structures in FIG. 3b is numbered identically with those same layers and structures of FIG. 3a. As can be seen from a review of FIGS. 3a and 3b, there is literally a bridge formed by residue circuit segment 58 as it passes between aluminum posts 52 and 64. A narrowed section 68 of the circuit segment 58 is again shown as an artifact of certain aspects of the process. This air bridge 50 tends to be a fragile component of the circuit boards manufactured and can be protected according to one aspect of the inventions. As shown in FIG. 3b, the bridge allows the interconnection of two circuits in the same plane by using the third dimension to crossover an electrically isolated circuit 66 which lies between the two posts in the same plane. As the circuit component provided by the air bridge is an essential and real element of the circuitry, and as this component would be relatively more fragile than some of the other components at least in part because of its relative dimensions, protection of the air bridge becomes important. After formation of the air bridge, low viscosity curable resin (room temperature curable, radiation curable, thermally curable, etc.) will be flowed between the outermost surface 54 of the bridge, the posts 52 and 64, and the lowermost metal layer 56. The curable resin should be selected on the basis of low degrees of dimensional change on curing to best prevent stress on the bridge during curing. The low viscosity is chosen to reduce stress on the bridge. The viscosity can be best lowered by the selection of the components of the resin system, as by choosing relatively lower molecular weight components for the majority of the ingredients (e.g., molecular weights below 100, below 800, below 650 or below 500, on a weight average molecular weight). The composition may be mildly heated (if it is not a thermally curable resin, or if the heating is controlled to reduce viscosity during flow, but avoiding any curing that would substantially increase viscosity during the flow process). Any non-conductive polymer, and preferably dielectric or insulating polymeric compositions are preferred for the structural support polymer that protects the air bridge. Examples and commercially available materials within this class are readily available, such as (meth)acrylate polymeric systems (the term "(meth)" indicates that the acrylate may comprise either a acrylate or methacrylate variant of the polymer, without having to specifically recite both types of polymers, such that (meth)acrylic acid is inclusive of both acrylic acid and methacrylic acid), epoxy resin systems, silicone resin systems (e.g., polysiloxanes), polyamide systems, polyesters, polyurethane systems and any other polymeric (including copolymeric, tripolymeric, etc. systems) systems. Although by controlling the flow rate of the curable polymer system under the bridge, some stress forces can be reduced, this might require extremely slow production rates for higher molecular weight/higher viscosity compositions, and is not preferred. The use of lower molecular weight materials with optimized and/or minimum amounts of solvent are desired, as the cure will cause less shrinkage in the product, which might leave voids under the air bridge or stress the bridge by pulling it along with the retracting resin front. Blends of the actual polymeric materials with additives to improve the performance of the polymer (e.g., coating aids, adhesion promoters, inert filler [e.g., micron-size silica], and the like) are also contemplated. The protective polymer application may be applied with a more targeted efficiency, such as screening, printing or spraying of a photo-imageable dielectric material over the aluminum etched ETM circuit for the purpose of:

1) Flowing under and over air bridges without bending or breaking them
2) Creating electrical termination pads that are completely surrounded, but free of 'ink'
3) Protecting the underlying circuit from corrosion, abrasion, vibration and physical damage
4) Producing multi-layer ETM on an inline coil process gives process economy, but introduces a difficult problem of precision alignment of 3 moving coils. We describe a system including accumulators and coil grippers or sprockets, which permit the precision positioning of the 3 layers with no relative motion. It is then possible to join them in a nip, hot roll lamination process.

The protective coating may be applied by a more complete coating process (e.g., dipping) and then the layer activated to polymerize or cure only in those areas where the protection is needed, such as with fragile circuit elements, leaving the remainder of the surface free of the adhesive/protective composition. Radiation curable compositions and thermally curable compositions (especially those which absorb infrared radiation to provide the heat) are particularly useful for this function.

After the formation of the complete etched tri-metal sub-element or after the etching of at least one pattern onto one of the exterior metal layers (e.g., layers 4 and 8 in FIG. 1), one of the etched exterior metal surfaces is bonded to a ground plane (e.g., 22 in FIG. 2) for support of the circuitry. The etched tri-metal circuit may be relatively fragile, depending upon the thickness of the various elements and layers, the dimensions of the circuit elements themselves, and the amount of additional structural support provided for the elements (e.g., the polymeric support for air bridges described above). It is therefore desirable to apply and adhere the etched tri-metal circuitry to the ground plane by carefully considered processes with effective materials. For example, in FIG. 2 a layer 42 is shown as a dielectric adhesive layer. This layer is preferably applied to the surface of the ground plane 22 to form a continuous layer. The adhesive may be applied to only the surfaces of the third metal layer 24, but this would tend to produce a discontinuous layer of adhesive (not shown). The dielectric adhesive may again be selected from among the various classes of commercial adhesives and polymers known to have dielectric properties, including at least the polymers described above. The dielectric does not have to be curable or crosslinking, although there are situations and constructions where that would be preferred. The adhesive may be solvent based and dry upon application of the parts to be adhered, or the adhesive may be activatable (e.g., thermally activatable, radiation activatable, solvent activatable, etc.). The adhesive may be applied by any conventional application method that can provide a controlled amount of the adhesive in a relatively even distribution over the surface of the ground plane 22. Such application methods include, but are not limited to spray coating, gravure coating, screen printing, knife-edge coating, roller coating, curtain coating, meniscus coating, and the like, as well as the application of a dry film adhesive layer. Again, the dielectric adhesive is preferably a crosslinking (meth)acrylate resin, which class of resins tend to provide a coefficient of thermal expansion that can be made compatible with that of the metal layers, displays good chemical and aerial oxidative stability, resistance to cleaners, etchants and fluxes, and provides good adhesive strength between the layers.

As indicated above, there is considerable flexibility and many variations allowed in the performance of the manufacturing process available for practice of the present invention. For example, after the etching of only one of the exterior metal layers (e.g., layers 4 and 8 of FIG. 1) and etching of the interior metal layer (e.g., aluminum layer 6 of FIG. 1), the etched exterior layer of metal may be adhered to the ground plane or any other support sheet by dielectric adhesive. Alternatively, the tri-metal element may have both exterior metal layers etched, and before or after etching of the interior metal (e.g., aluminum) layer, the element may be bonded to the ground plane or other support layer by the dielectric adhesive. If the tri-metal element was adhered to the ground plane or support layer (e.g., a non-conductive polymeric carrier sheet such as polyester [e.g., polyethyleneterephthalate, polyethylene naphthalate], polydivinylfluorine, polyetrafluoroethylene, polysulfones, polyimide, and the like) prior to etching of the interior layer, that interior layer may be etched after the adherence of the tri-metal element to the ground plane or support layer. As in one of the preferred practices, the ground plane (e.g., a copper sheet, aluminum sheet, polymer-coated or not, as with epoxy resin) is preferably a copper sheet (e.g., 0.5 to 500 mil, 0.013 to 13 mm); the selection of the etchant for the aluminum that has already been made on the basis that it will not substantially etch the exposed copper (e.g., of layers 24 and 28 of FIG. 2) will avoid etching of a copper ground plane. The etching of the central aluminum core layer from a Cu/Al/Cu structure can result in oxidation of the copper circuits, which may or may not have to be cleaned away. The photoresist, which was used to pattern the copper circuits also needs to be removed. The present process can enable stripping the resist and removal of the oxide from the copper, leaving the copper termination ready for the next process step.

Figure 4:
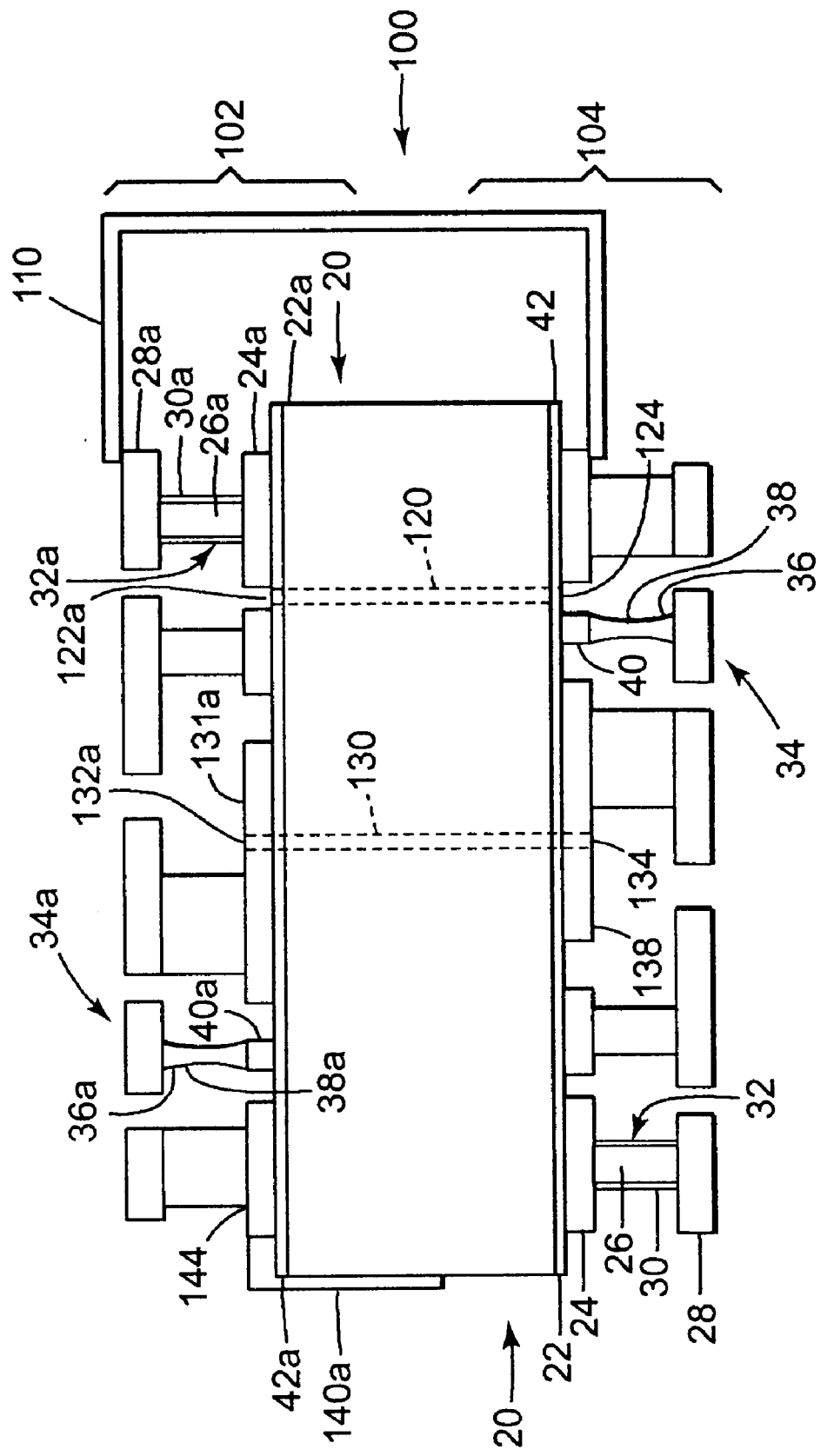
FIG. 4 shows a circuit board formed by the lamination of two etched tri-metal subelements onto an intermediate support surface.

FIG. 4 shows some additional aspects that may be practiced within the framework of the invention. FIG. 4 shows a circuit board element 100 comprising two distinct circuit elements 102 and 104 similar to those of FIG. 2 on opposite sides of a ground plane 22. The lower case symbol "a" in the numbering merely differentiates the upper layer 102 from the lower layer of circuitry 104. Connection circuitry may be provided between various individual tri-metal, subelements by any convenient form of electrical connection, some of which are exemplified in FIG. 4. A multiple circuit board element 100 may have external electrical connections 110, through holes 120 that require wire or other connector elements (not shown) at the exits 122a and 124 of the through hole 120, direct connection of through holes 130 to third metal layers 136a and 138. The through holes 120 and 130 may be filled with conductive material (e.g., conductive solder), or may carry a wire or other electrical connector (not shown) within the holes 120 and 130, or by an external side-wall connection 140a, here shown connecting the third metal layer circuitry 144 to the ground plane 22. It is also to be noted that FIG. 4 may represent only a single element within a layered printed circuit board and is not the limit of practice of the invention. After a circuit board element 100 like that of FIG. 4 has been completed, the entire element may be stacked (with intervening additional ground planes or insulating layers or dielectric layers) to complete more complex circuits. Additional through holes and electrical connections may be used to connect the various circuit board elements as required, as is well known in the art. Outer layers 28 and 28a may be adhered to the intervening layers by way of separate applications of adhesive, as was done for securing layers 24 and 24a as described above. the side walls of holes, (which include both dielectric material and dissimilar metals), by a process described as 'black hole plating'. The through holes may be made by drilling, punching, etching, laser ablation or other chemical or mechanical processing. The through holes may be plated or filled with conductive material or dielectric material as desired. A conductive layer may be attached to the side walls of the holes (which include both dielectric material and dissimilar metals) by a metallization process such as black hole plating. The plated area coverage is controlled by a photoresist, which must be removed by a process called stripping. A second solder mask operation added to cover the aluminum in the via hole eliminates entrapment of corrosive materials and increases through-hole density. To assure a highly adherent through-hole plating to ETM which contains an aluminum layer, we have learned that zincating or anodizing the aluminum aids in the adhesion of conductive layers to the aluminum. To effect secure and air-free adherence between joined layers, it is suggested to use an autoclave, which provides a vacuum to eliminate air between layers laminated together with heat.

In the practice of the present invention, we have worked extensively with the copper/aluminum/copper system and have reduced the ability to provide precise electrical crossover to practice. This system is believed to have the best combination of electrical and thermal conductivity for metals forming the component parts that have been etched in different chemical systems. The materials of the present invention may also be formed by the etching of separate sub-elements, at least one of which is the tri-metal sub-element preferred in the practice of the invention, with the pre-etched sub-element fed in sheet or coil form to be attached/aligned with the ground plane and other circuit oriented sub-elements. The precision alignment and superposition of material from 3 separate, moving coils is difficult. The multi-layer ETM (Etched Tri-Metal) circuits can be produced by aligning cut sheet 'postage stamp' ETM circuits precisely over a central core layer which has holes and vias to permit electrical interconnections.

ETM depends on the ability to etch circuits in the outer metal layers without attacking the central core, which is a different metal. To improve circuit density (smaller lines and spaces) we strive for an optimum etch profile (vertical profile with large ratio of depth to undercut width) and a minimum etch time (for process economy). Copper etchants which give the best etch profiles attack the aluminum core. The peroxy-sulfuric system, which etches copper in the presence of aluminum, gives a poor profile. We, assert that higher circuit density can be achieved by making all metal layers thinner. Cupric chloride etchant with a high concentration of aluminum, can be used for higher etch rates for the copper layer(s) without attacking the core (LeChatlier principle). If an oxidizing agent is present within the etchant that does not attack copper, low chloride ion content solutions may be used to etch the aluminum.

The use of a dielectric having thixotropic properties such that it coats both the top and side walls of a hole, without a secondary application that would prevent the coated surface from being planar around the opening of the hole and/or introduce bubbles that could cause failure or blemish problems, particularly at elevated temperatures occurring during manufacture or use. A viscosity for the compositions of from about 1 to 200 cps at room temperature is a generally useful range. The hole size, the relative surface tension of particular solutions to particular substrates, may be considered in adjusting the preferred range of this property, as to between 2–100 cps, 2 to 75 cps or 5–75 cps.

The present invention offers some unique capabilities for particular technical fields and markets where large volumes of related circuits, but not necessarily identical circuits, are needed. As a preferred example of this aspect of the technology circuit boards for use in automobiles will be examined, without excluding the contemplation of circuit boards for computers, maritime vehicles, trucks, aviation equipment (including planes), television sets, monitors, game machines, gaming machines (including video slot machines and other video gaming machines), radios and CD players, recording machines, duplicating machines, and any other apparatus that requires circuit boards, particularly circuit boards that can be used to provide multiple functions or connections to multiple functions (multiple requiring at least two different functions, but including functions into the thousands or even tens of thousands). Although the process is useful in batch operations (where circuit boards are made individually, one-at-a-time, from distinct sub-elements, the process will be described with respect to the use of a continuously fed sheet of tri-metal material as the preferred process.

A resist layer is first applied to at least one of the outer metal layers (the copper layers in the preferred practice). Each resist layer is imagewise exposed to leave a resist pattern (thus either a negative-acting resist or positive-acting resist film may be used) on a copper surface layer. The copper layer is then etched in accordance with the pattern, leaving sections of the aluminum layer exposed to the environment. The formation of an image on the surface or the imaging of a continuous resist layer is preferentially performed by exposure of a resist layer to radiation that alters the solubility of the resist layer. Each resist layer on the exterior surface of the tri-metal sub-element may be individually exposed (which includes exposure on both sides of the element that is simultaneous in time from two distinct imaging systems or a single imaging system in which a beam is split, with each split segment of the beam directed at the different resist layers to form distinct exposure images, as by appropriate reflection and direction of the split beams from separate rotating directional mirrors, as is known in other surface exposure systems) and individually or simultaneously developed. Individual development may be effected, for example, by spraying developing solution onto only one exterior surface, while simultaneous development may be effected, for example, by immersion of the element into a bath of developer. One or more of the exterior metal layers may be etched in a manner similar to developing. After one or both of the exterior metal layers are developed, the interior metal layer of a different metal that was not substantially etched by the etchant solutions for the two exterior metal layers is then etched. The pattern of one or more of the etched exterior metal layers may be used as the mask layer or that etched exterior layer mask may be supplemented by the application of additional resist-forming material (e.g., photoresist or thermal resist) or a pattern of resist material is applied in the desired pattern. Thus, at least two adjacent or two opposed metal layers (e.g., the two exterior metal layers of a three layer metal sandwich) of the tri-metal sub-element have been etched into a circuit pattern at this point, or three metal layers have been etched at this point. An exterior etched metal layer is then bonded to a support layer (inclusive of a ground layer) by appropriate or available means, such as the application of a layer of dielectric adhesive to the surface of the support layer (or the support layer itself may be non-conductive or a dielectric layer, or comprise a conductive layer with a dielectric coating or layer) and the adhesion of the etched exterior metal layer to the dielectric adhesive layer. If the other exterior metal layer has not yet been etched, it would be etched at this time. If fragile artifacts or circuit elements (such as air brides or very fine lines) are to be protected against damage, particularly during the lamination process of the tri-metal sub-element after etching, the application of the protective polymer (discussed) above, should have to be provided prior to the lamination.

An important aspect of control and efficiency in the use of a sheet of tri-metal materials, particularly where the products to be produced may be individually tailored for application into major products, such as panels for the automotive industry or other mass production industries where large numbers of different circuit boards may be desired, is the ability of the system to be automated with respect to circuit design. This can be readily accomplished within the skill of the ordinary artisan with the direction provided by this description of the invention.

As the photoresist coated (on at least one side) sheet of tri-metal material progresses along the manufacturing path, a computer program directs the specific pattern of exposure to be used on an identified surface area and volume (identifying the entire circuit, including the opposed surface) of the sub-element. The pattern may be provided by input of information from manufacturing sheets or order sheets. For example, if orders are received for 100 Lincoln Crown Victorias, information is provided to the imaging apparatus of the specific sequence of circuit board designs that have been requested. Each circuit board is identified (e.g., by numbering that may be applied to the individual board, bar codes, etched information, etc.) and/or information is provided along with the finished roll of completed tri-metal sheeting so that the appropriate circuit board may be identified from the associated information for proper installation of that particular circuit board to the particular car order for which that circuit board has been designed. The order of the resists may merely be aligned with the intended order of production of the cars (so that, in effect, the line of circuits boards flows in registration into the flow of cars), but additional identification of the circuit boards that can be matched with the individual car order is preferred. The boards may be carried in sequence on the sheets to be laminated into finished boards, which themselves may be labeled or otherwise identified (e.g., an identification chip or magnetic information identifying the nature of the specific circuitry or order number for that particular circuit board) for the specific car ordered. The finished circuit boards may then be boxed or packaged in order of the production line sequence for the cars, along with the individual circuit board/order identification.

One of the advantages of this system is that each ordered car may be designed with as many as one thousand or more permutations of electrical systems and would preferably also allow for adjustment of the electrical system of the vehicle, provide back-up circuitry, an enable advanced systems to be upgraded onto the car without replacement of the entire circuit board. For example, certain features would be standard within the circuit design, such as road lights, head lights, brake lights, warning lights, power steering, seat belt warning systems, panel lights, overhead lights, and other fundamental systems of the automobile. Other optional systems would have to be provided for the vehicle's circuit board, such as for air conditioning, antiskid breaking systems, sound and tuner systems, automatic door locks, RF control locks, car phone systems, global positioning guidance systems (GPS), rear seat entertainment systems, power controlled seat movement, forward looking radar, magnetic strip readers (for magnetic strips embedded in the road surface), alarm systems, data collections systems, automatic windows, and the like. In addition, there are many options in the design stage that would be desirable to add to existing cars, rather than having to purchase a new car to have such systems available in the vehicle. Such systems include PC connections within the automobile, rear seating entertainment systems, and the like. As adding circuitry sufficient to cover every variable would be more expensive than manufacturing less complex circuitry specific to each vehicle, by reducing the average amount of artwork needed for the printed circuit boards, the through rate and efficiency and cost of production can be improved.

Figure 5:
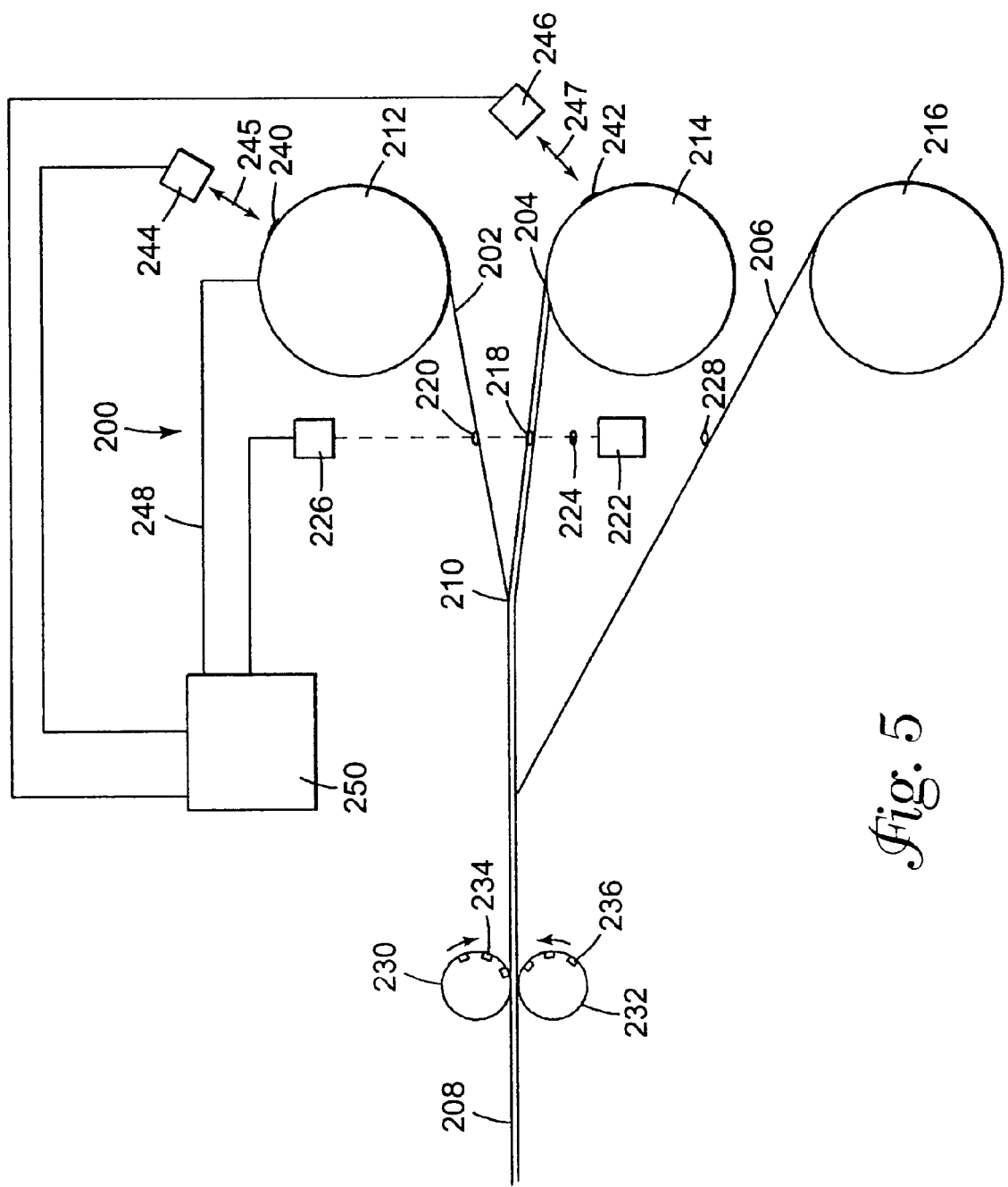
FIG. 5 shows the feed of three layers from coils with registration of elements on the various layers.

FIG. 5 shows a system 200 for the lamination of three separate film elements 202 204 and 206 into a single laminated circuit element 208. The three separate film elements 202 204 and 206 are provided from three separate rolls or coils 212 214 and 216, respectively, of the three separate film elements 202 204 and 206. The three separate film elements 202 204 and 206 may be fed so as to first form a two layer contact sheet 210 or may meet at a common point (not shown) to form the single laminated element 208. In the case where film elements 202 and 204 in the FIG. 5 are formed into a two layer element 210, there may or may not need to be separate nip or laminating rollers (not shown) before the two layer element 210 is brought into contact with film element 206 to form the three layer laminate 208. In a general description of the practice of the present invention, a description of the three separate film elements would be 202 (tri-metal etched circuit layer), 204 (ground layer or dielectric layer) and 206 (tri-metal etched circuit layer). An adhesive (not shown) may be present or even needed on various surfaces of these layers to assure adherence between the layers, being provided as original coatings on the layers, after applied coatings or as film adhesive layers. The film element 204 is shown with a through hole (made by any convenient process), and film element 202 likewise has a through hole 220. A light emitting device 222 is shown emitting a beam 224 of sensable radiation, such as infrared, visible, ultraviolet or radio wave radiation. The radiation is preferably of a narrow wave band, even though broad spectrum radiation could be used, because narrow wavebands of radiation, and especially collumnated radiation (laser radiation) can provide more accurate registration with less dispersion of radiation as it passes through holes. The beam 224 is shown passing through holes 218 and 220 towards a detector 226. The detector will sense when radiation passes through both holes 218 and 220 and reaches the detector 226 thereby signalling registration of desired holes (e.g., 218 and 220) in two separate film elements 202 and 204. Failure to receive radiation, receipt of insufficient radiation, or localized receipt of radiation by the receptor 226 would be an indication of complete misalignment of the registration holes, incomplete etching of holes or partial misalignment of the holes, and even the direction of misalignment of the holes (where the receptor has been calibrated and stored within memory in the computer 250 indicating that certain types or area distributions of signals indicate specific directions of misalignment), respectively. Etched patterns within the holes may be used to match or mismatch patterns or radiation so that either visual or mechanical alignment can be determined by the degree of overlap between light passing through one pattern through or onto another etched pattern. These may be referred to as light slits or light slit patterns.

Similarly, physical registration elements, such as the post 228 that would align with the hole 218 or another hole (not shown) could be present to identify registration. This system of physical registration could be sensed either visually by an operator in control of the system 200 or mechanically in the following manner. A pair of nip rollers 230 232 are provided with matched sensing system elements 234 and 236 which can sense through the laminate 208 or earlier on 210. The sensing system may comprise two electrical elements embedded in the rolls 230 and 232, such as an electrical emitting element 234 and an electrical receptor element 236 so that when the pin 228 has passed through the hole 218, the nip rollers 230 and 232 can detect the passage of current through the laminate 210, indicating alignment. Failure of a current would indicate lack of alignment. This detection should be performed before the elements (e.g., before 202 and 204) have been laminated so that the materials are not wasted before detection of misalignment.

Another alternative system that could be used in the practice of the invention, which is considered a preferred aspect of the invention, is the provision of registration marks (e.g., 240 and 242) on the rolls of sheet materials (e.g., 212 and 214, respectively) that can be mechanically read. For example, emitter/sensors 244 and 246 emit radiation and detect reflected radiation 245 and 247, respectively, sensing specific positions on the sheet material carried on the rolls 212 and 214, respectively. This sensed information is then transmitted to the computer 250, which analyses the information to determine the relative positions of the two sheet materials 202 and 204, respectively and their relative positions. This information is then used to determine the registration or degree of registration of the sheet materials 202 and 204. The computer may also redirect information along a connection 248 to a drive motor (not shown) for one or more roll drivers (e.g., for roll 212) to adjust the movement or position or speed of the sheet material 202

EXAMPLE

The following non-limiting example is provided to give an example of a typical process according to the present invention to support rather than limit the practice of the present invention.

A cleaned and degreased tri-metal subelement comprising 2 mil copper/6 mil aluminum/2 mil copper (in a clad system) was coated with a photoresist (a commercial dry-film negative-acting photoresist from Shipley, Dynachem or Morton 5032, 1.3 mil) and the resist was imagewise exposed with ultraviolet radiation (in a pattern of an electronic circuit, including preliminary patterns for at least one air bridge). The exposed resist was developed in sodium carbonate solution removing unexposed resist. A copper etchant comprising cupric chloride was used on the imaged surface, etching the copper down to the aluminum layer. The etch of the copper layer should preferably just barely engage, expose, or approach the aluminum layer when a strong etch solution (such as cupric chloride and oxidizing agent) is used, and then when the first surfaces of the underlying aluminum are about to be exposed or are exposed by etch of the copper layer, an etch that is much less active against the aluminum should replace the first active etch, such as Electrochemicals PERMAETCH™. A water rinse was used over the etched surface. A similar resist coating/exposure/etching step was contemporaneously performed on a second copper surface layer, using the same chemistry. Intermediate rinsing steps, resist stripping steps (after exposure, development and etching), oxide removing steps, drying steps, and degreasing steps were used. Registration holes were also punched into the etched tri-metal subelements. After both exterior copper layers had circuit patterns etched thereon, a copper ground layer was coated with a dielectric adhesive, brought into contact pressure with an etched copper surface of the tri-metal subelement and laminated together. The registration holes were used to visually line up the proper positions of the etched tri-metal subelements with proper positions (also identified with registration marks) on the ground layer. Instead of visual alignment or confirmation, an automated system could readily be applied wherein an infrared emitting diode directs radiation towards an intended congruence of through holes (i.e., two through holes that are intended to form a connecting path) and an infrared detector is placed on the opposite side of the two holes to detect if sufficient infrared radiation has passed through the two holes. The laminated tri-metal subelement/ground layer composite was then exposed to an aluminum etchant solution comprising sodium hydroxide and sodium nitrate at a pH above 11, etching through the aluminum and leaving posts between the two etched copper surface layers. A water rinse was then used and the composite article air dried. Residues of other layers, such as resin, polymer, or metal artifact layers were then removed by, for example, another Electrochemicals PERMAETCH™ etch/wash bath at this stage. Where air bridge structures were formed in the composite, a photocurable, low viscosity epoxy resin was screen printed onto the air bridge structures, then irradiated to cure the resin. This composite could be used to form a stacked circuit board either by:

a) adhering an etched surface of a second tri-metal subelement to a second surface of said support layer and/or b) adhering a second support layer to said third or first metal layer, respectively, and adhering an etched surface of a second tri-metal subelement to said second support layer. These additive steps can be repeated to build up a circuit board with many different layers. The through holes may be drilled at various stages of the manufacturing process and the plating or solder filling of the through holes may be performed at various stages also, at the convenience of the manufacturer. The through holes are used to electrically connect desired elements of the circuitry between layers.

Silvering of the exposed copper surface is then effected by immersion or other form of contacting between the etched surface and silvering compositions such as an Alpha-LEVEL™ silver plating bath.

Rather than laminating the rolls as continuous rolls of etched materials, after the etching steps, the etched trimetal subelements may be cut into smaller (non-continuous sheets) and these segments laminated with registration to other surfaces or circuit elements. The individual segments may be combined with these other layers as single circuit subelements, or sets or intermediate size sheets of elements, all combining being performed with registration between needed elements. Individual elements may also be lifted and positioned onto substrates in coil form, and bonded in some suitable manner.

What is claimed:

1. A process for the etching of multiple layers of at least two different metals comprising:

forming a resist pattern over a first layer of metal, said resist pattern having a pattern of openings therein applying a first etch solution onto said resist pattern so that at least some etch solution contacts exposed areas of the first layer of metal, etching away the majority of the depth of the first metal in exposed areas of metal in the first layer of metal, applying a second etch solution onto the resist pattern the second etch solution having a rate of etch towards the first metal as compared to the first etch solution that is at least 20% less than the millimeter/minute rate of etch of the first etch solution at the same etch solution temperature, removing the second etch solution from said resist pattern after at least the first metal layer has been etched sufficiently to expose areas of a second metal layer underlying the first metal layer by forming an etched first metal layer, and applying a third etch solution to said etched first metal layer, the third etch solution having a faster rate of etch towards the second metal than towards the first metal to etch into said second metal layer without destroying the etched first metal layer.

2. The process of claim 1 wherein the first and second etch solutions comprise solutions with a pH below 10.0 and the third etch solution comprises a basic solution having a pH of at least 10.5.

3. The process of claim 2 wherein the first and second etch solutions comprise at least one active ingredient in common between the two solutions, with the concentration of the common active ingredient being less than 75% the concentration in the second etch solution than in the first etch solution.

4. The process of claim 1 wherein the second etch solution comprises a solution having a pH of at least 11.0 and an oxidizing agent.

5. The process of claim 2 wherein the second etch solution comprises a solution having a pH of at least 11.0 and an oxidizing agent.

6. The process of claim 3 wherein the second etch solution comprises a solution having a pH of at least 11.0 and an oxidizing agent.

7. The process of claim 2 wherein the second etch solution comprises a) an alkali metal hydroxide or an alkaline metal hydroxide and b) an oxidizing agent.

8. The process of claim 3 wherein the second etch solution comprises a) an alkali metal hydroxide or an alkaline metal hydroxide and b) an oxidizing agent.

9. The process of claim 4 wherein the second etch solution comprises a) an alkali metal hydroxide or an alkaline metal hydroxide and b) an oxidizing agent.

10. The process of claim 5 wherein the second etch solution comprises a) an alkali metal hydroxide or an alkaline metal hydroxide and b) an oxidizing agent.

11. The process of claim 6 wherein the second etch solution comprises a) an alkali metal hydroxide or an alkaline metal hydroxide and b) an oxidizing agent.

12. The process of claim 2 wherein the first metal layer comprises copper and the second metal layer comprises aluminum.

13. The process of claim 5 wherein the first metal layer comprises copper and the second metal layer comprises aluminum.

14. The process of claim 6 wherein the first metal layer comprises copper and the second metal layer comprises aluminum.

15. The process of claim 7 wherein the first metal layer comprises copper and the second metal layer comprises aluminum.

16. The process of claim 8 wherein the first metal layer comprises copper and the second metal layer comprises aluminum.

17. The process of claim 11 wherein the first metal layer comprises copper and the second metal layer comprises aluminum.

18. A process for the etching of at least connected metal layers, wherein one layer comprises copper and another layer comprises aluminum, wherein the copper layer is etched with an acid solution and the aluminum layer is etched with a solution having a pH of at least 10.5 in the presence of an oxidizing agent.

19. The process of claim 11 wherein the oxidizing agent is selected from the class consisting of metal salts of inorganic acids or organic acids, ferric salts of organic oxidizing acid, metal bromates, hydrogen peroxide, metal nitrates, metal nitrites, metal borates, metal phosphates, and ferricyanide salts.

20. The process of claim 18 wherein the oxidizing agent is selected from the class consisting of metal salts of inorganic acids or organic acids, ferric salts of organic oxidizing acid, metal bromates, hydrogen peroxide, metal nitrates, metal nitrites, metal borates, metal phosphates, and ferricyanide salts.

* * * * *